United States Patent [19]

Hennig

[11] Patent Number: 5,757,185
[45] Date of Patent: May 26, 1998

[54] METHOD FOR MAGNETIC RESONANCE IMAGING OBSERVATION OF THE MOTION OF IONS AND MOLECULES IN AN ELECTRIC FIELD

[76] Inventor: Jürgen Hennig, Johann-von-Weerth-Str. 12, D-79100 Freiburg, Germany

[21] Appl. No.: 762,760

[22] Filed: Dec. 10, 1996

[30] Foreign Application Priority Data

Dec. 14, 1995 [DE] Germany .................... 195 46 648.9

[51] Int. Cl.$^6$ .................................................. G01V 3/00
[52] U.S. Cl. .................................... 324/300; 324/306
[58] Field of Search .................... 324/300, 306, 324/307, 309, 314

[56] References Cited

U.S. PATENT DOCUMENTS

| | | | |
|---|---|---|---|
| 5,125,407 | 6/1992 | Harms et al. | 324/309 |
| 5,214,380 | 5/1993 | Dumoulin | 324/300 |

FOREIGN PATENT DOCUMENTS

| | | |
|---|---|---|
| 0361942 | 4/1990 | European Pat. Off. . |
| 0646257 | 2/1979 | Sweden . |

OTHER PUBLICATIONS

Ber. Bunsenges. Phys. Chem. 86, 141–147 (1982): Manfred Holz and Christian Müller: "Direct Measurement of Single Ionic Drift Velocities in Electrolyte Solutions. An NMR Method."

"Flow Imaging by Means of 1D Pulsed–Field–Gradient NMR with Application to Electroosmotic Flow" by Donghui Wu et al. in: Journal of Magnetic Resonance, Series A115, pp. 123–126 (1995).

"Mobility–Ordered 2D NMR Spectroscopy for the Analysis of Ionic Mixtures" by F. Morris et al. in: Journal of Magnetic Resonance Series A, pp. 67–73 (1993).

G.C. Scott et al.: "RF current density imaging in homogeneous media", in: Magnetic Resonance in Medicine 28 (1992), No. 2, pp. 186–201.

P.W. Atkins: Physikalische Chemie, VCH Verlagsgesellschaft, Weinheim (1990), pp. 648–685.

L.E. Crooks et al.: Vascular Diagnostics (eds. P. Lanzer and J. Rösch) Springer Velag, Heidelberg (1994), p. 366.

D. LeBihan et al.: "Diffusion and Perfusion" in: Magnetic Resonance Imaging (eds. D.D. Stark et al.) Mosby Year Book, (1992), pp. 335ff.

J. Henning: "The application of phase rotation for localized in vivo proton spectroscopy with short echo times", in: Journal of Magnetic Resonance 96, (1993), pp. 40–49.

D.G. Nishimura et al.: "Magnetic Resonance Angiography", in: IEEE Transactions on Medical Imaging, vol. MI–5, No. 3, (1986), pp. 140–151.

"Analytical Method for the Compensation of Eddy–Current Effects Induced by Pulsed Magnetic Field Gradients in NMR Systems" by P. Jehenson et al. in: Journ.of Magn.Reson. 90, pp. 264–278 (1990).

*Primary Examiner*—Louis M. Arana
*Attorney, Agent, or Firm*—Paul J. Vincent

[57] ABSTRACT

A method of nuclear magnetic resonance (NMR) spectroscopy subjects a sample located in a homogeneous external magnetic field to a sequence of two radio frequency (RF) pulses whose strength and duration are chosen to produce an NMR signal, wherein a time and spatially variable magnetic gradient field GF is applied in a time interval between the first RF impulse exciting the NMR signal and read-out of the signal, and an electric field is applied during the excitation sequence. The magnetic gradient field GF is chosen to cause a velocity-dependent change in the phase and/or amplitude of the signals from spins moved in the direction of the magnetic gradient field GF by the electric field and changes in the signal phase and/or signal amplitude of the NMR signal due to the electric field induced motion of spins in charged, polar, or polarizable molecules along the magnetic gradient field are subsequently observed. The method allows for the observation of transport processes of ions and molecules analogous to conventional processes of electrochemistry.

15 Claims, 12 Drawing Sheets

| | $\Phi_{stat}$ | $\Phi_{cflow}$ | $\Phi_{eflow}$ |
|---|---|---|---|

| 0 | $-\tau^2 vG$ | $-\tau^2 vG$ |

| 0 | $-\tau^2 vG$ | 0 |

| 0 | 0 | $-2\tau^2 vG$ |

| 0 | $-4\tau^2 vG$ | 0 |

| 0 | $-4\tau^2 vG$ | 0 |

METHOD FOR MAGNETIC RESONANCE IMAGING OBSERVATION OF THE MOTION OF IONS AND MOLECULES IN AN ELECTRIC FIELD

BACKGROUND OF THE INVENTION

The invention concerns a method of nuclear magnetic resonance (NMR) spectroscopy with which a sample located in a homogeneous external magnetic field is subjected to at least one and preferentially to a sequence of at least two radio frequency (RF) pulses whose strength and duration are adjusted to produce an NMR signal, wherein a magnetic gradient field GF, variable in time and space, is applied in the time interval between the first RF pulse which excites the NMR signal and read-out of the signal, and wherein an electric field is applied during the excitation sequence.

A method of this type is known in the art from the technical article of G. C. Scott, M. L. Joy, R. L. Armstrong and R. M. Henkelman: "RF Current Density Imaging in Homogeneous Media", Magnetic Resonance in Medicine 28 (1992), No. 2, pp. 186–201.

Nuclear magnetic resonance (NMR) spectroscopy is one of the most important methods for analysis and characterization of substances. A plurality of measurement methods allow not only for identification of unknown substances based on their NMR spectra but also facilitate detailed statements concerning the molecular structure of the substances under investigation. However, NMR methods known to date either fail to differentiate between differing substances in a substance mixture or do so only indirectly. In the method due to G. C. Scott et al. cited above, only the change in the magnetic field caused by application of the electric field is indirectly analyzed through measured changes in all recorded NMR signals. Changes due to the dynamics of the spin-bearing particles remain unobserved and, in particular, there is no differentiation between differing substances influencing or contributing to the NMR signal.

Such a differentiation can be achieved e.g. by microscopic separation of a substance mixture using the differing drift velocities in an electric field. Although a characterization of the individual components can be carried out using NMR spectroscopy, this nevertheless requires complete separation of the substance mixture and this is often extremely difficult and time consuming if not completely impossible for physical reasons.

The transport processes of ions and molecules in electric fields is subject material of electrochemistry. The characteristic quantities thereby observed include the deposition of chemical substances on the electrodes generating the field. The conductivity or, when utilizing alternating fields, the impedance of the system under investigation can be utilized as a physical measurement quantity. Separate observation of the contributing charge carriers (cations and anions) is not possible with conventional instrumentation and is effected only in a secondary fashion using the resulting macroscopic displacement of the substances under investigation. Motion in the electric field is thereby not only due to ions moving as primary charge carriers towards the corresponding electrodes, but also due to intrinsically uncharged polar or polarizable substances in consequence of interactions with ions in the molecular environment.

The drift velocity is, for given field strength, determined by the charge of the moving particle as well as by the viscosity of the surrounding medium. The ion mobility u is a characteristic quantity which determines the velocity s reached by a particle in an electric field E of strength 1 V/cm (see P. W. Atkins, Physikalische Chemie [Physical Chemistry], VCH Verlagsgesellschaft [VCH publishing house], Weinheim, 1990, pp. 648–685)

$$s = u E \tag{1}$$

With the assistance of the diffusion equation, the ion mobility can be used to calculate an effective ion radius. This radius can be significantly larger than the actual particle size since, depending on the environment, charged particles carry along with them a salvation envelope of greater or lesser extent.

When investigating particle drift in electric fields one must initially recognize that the electric currents induced by the ion motion cause, for their part, magnetic fields which change the magnetic field at the location of the components under investigation. In this fashion, a displacement of the NMR spectroscopic measured resonance frequency occurs. The magnetic field generated by a current having a particular current density can be calculated using the Biot-Savart law. The local magnetic fields thereby occurring have already been observed using magnetic resonance imaging with the assistance of so-called "current density imaging", as described in the above quoted technical article of G. C. Scott et al.

Magnetic resonance imaging methods for direct observation of motion have been disclosed in the technical literature. The principle behind the methods is based on the differing development of the signal phase of stationary and moving particles in a magnetic field gradient along the direction of motion (see L. E. Crooks, N. M. Hylton in Vascular Diagnostics, eds. P. Lanzer and J. Rösch, Springer Verlag, Heidelberg, 1994, p. 366). It can thereby be shown that the signal phase of stationary tissue returns to its initial value after application of a bipolar gradient, whereas the phase of moving nuclei undergoes a dephasing proportional to the velocity of motion as well as to the strength of the magnetic field gradient. Instead of a bipolar gradient with signal read-out via free induction decay (FID), for practical applications signal read-out in the form of a spin-echo can be utilized, wherein the application of two gradients of equal integral strength and symmetric about the refocussing pulse are applied for generation of the echo instead of the bipolar gradient.

Same is particularly advantageous when extremely strong gradients must be utilized for measurement of very small velocities and require an amount of time which is no longer negligible relative to the decay time constant $T2^*$. Due to signal decay with spin-echo relaxation time T2, which is longer than $T2^*$, associated long read-out times in the region of several hundred milliseconds can be realized resulting in corresponding enhancement of the velocity encoding. In this way diffusion can also be measured using appropriate gradient strengths. Since diffusion motion is non-directional, the dephasing of the nuclei of the observed spin ensemble occurs stochastically. The diffusion effect thereby manifests itself as a signal reduction due to the destructive overlap of the stochastically dephased individual magnetizations (see D. LeBihan, R. Turner, "Diffusion and Perfusion" in 'Magnetic Resonance Imaging', eds. D. D. Stark, W. G. Bradley, Mosby Year Book, 1992, pp. 335 ff.). Due to the fact that the corresponding velocity and diffusion methods differ only with regard to the strength of the gradient field utilized, only velocity-sensitive measurement methods are discussed below and their appropriate application to diffusion effects is hereby implied.

The purpose of the present invention is to present an NMR spectroscopic method having the above mentioned features with which transport phenomenon of molecules and ions can be observed as in the above described conventional methods of electrochemistry.

SUMMARY OF THE INVENTION

This purpose is achieved in accordance with the invention in that the magnetic gradient field GF is chosen in such a fashion as to effect a velocity-dependent change in phase and/or amplitude of signals from spins moved in the direction of the magnetic gradient field GF by the electric field, and changes in the signal phase and/or signal amplitude of the NMR signal which are due to the electric field induced motion of the spins in charged polar or polarizable molecules along the magnetic gradient field are subsequently observed.

The method in accordance with the invention concerns the nuclear magnetic resonance spectroscopic observation of ions and molecules in an electric field. Towards this end, charged particles are set into motion through the application of an electric field which can be appropriately varied in time and space. The measurement thereby takes place in an external magnetic field so that the motion caused by the electric field can be monitored with the assistance of nuclear magnetic resonance spectroscopic methods. An important consequence of the method is the nuclear magnetic resonance spectroscopic differentiation of the signals from substances located in the measuring apparatus which have differing mobilities in the electric field. This method thereby allows separate analysis of individual components of substance mixtures without requiring a macroscopic separation of the mixed components.

In the method in accordance with the invention described herein, the motion of ions and molecules effected by electric fields is measured with the assistance of motion-sensitive NMR methods so that the signals from substances having differing drift velocities in an electric field can be differentiated. As a result of same, an assignment of the spectral components of the NMR spectrum to the corresponding individual components based on their drift velocities is facilitated without having to undertake macroscopic separation of the substance mixture. In particular, the differing drift dependences of cations and anions, which are macroscopically non-separable, can be investigated in this fashion. Application of the described measuring procedure is, however, in no way limited to the investigation of primary charged ions. The motion of polar and polarizable molecules is similarly observable, in particular when ions which interact with the uncharged molecules are present in the measurement solution.

With simultaneous application of a magnetic field, as is necessary for the NMR measurement in the method in accordance with the invention, one must recognize that the motion of a charged particle can be influenced by the magnetic field. In particular for motion perpendicular to the magnetic field, a sideward deflection takes place (so-called Hall-effect), which leads to a cork-screw-like trajectory of motion for certain field configurations.

Diffusion through Brownian motion is superimposed upon the motion induced by the electric field. For weak electric fields having calculated drift velocities due to the ion mobility which are significantly below the velocities caused by diffusion, substance transport is essentially effected by the concentration gradients caused e.g. by deposition on the electrodes and manifests itself as anisotropic components in the diffusion tensor. Only when the field-induced drift velocity exceeds the diffusion velocity does the motion vector in the direction towards the electrodes dominate. Both limiting cases can be investigated with suitable NMR spectroscopic measuring methods so that only a limitation in the choice of measuring method is thereby effected and not a fundamental limitation in the method.

In the subsequently described variations of the method in accordance with the invention, auxiliary fields e.g. the electric or magnetic gradient fields cause complications which must be addressed through suitable execution of the method. With conventional field distributions the local field displacement can also be used to determine local differences in ion drift. Finally, as further described below, variations of the method are possible with which the actual data acquisition takes place without electric field and therefore also without the associated secondary magnetic fields.

A variation of the method in accordance with the invention is preferred with which the electric field is applied parallel to both the homogeneous external magnetic field as well as to the magnetic gradient field GF. In this fashion the longitudinal component of the motion caused by the electric field can be measured.

In order to prevent magnetic field changes caused by current flow and frequency changes caused thereby during read-out of the NMR signal, an additional advantageous variation of the method in accordance with the invention provides for application of the electric field only during the excitation phase and not during data acquisition.

An embodiment is also advantageous with which the strength and duration of the time-variable magnetic gradient field GF is chosen in such a fashion that stationary spins have no change in phase, whereas moving spins undergo a velocity-dependent dephasing. In this fashion information concerning the motion of the observed particles is particularly emphasized in the measured NMR signal.

A variation of the method is advantageous with which the strength and duration of the electric field and of the magnetic gradient field GF are chosen in such a fashion that no phase-change occurs both for the stationary spins as well as for spins moving with constant velocity in time, whereas the phase of spins moved by the electric field changes in a velocity-dependent manner. In this fashion, in augmentation of the method variation described above, signals from spins exhibiting similar motion are also filtered out so that only particles accelerated by the applied electric field are targeted for observation.

Conversely, another variation in the method provides for selection of the strength and duration of the electric field and of the magnetic gradient field GF in such a fashion that no change in phase occurs for the stationary spins and for spins moved by the electric field, whereas the phase of spins moving with constant velocity in time changes in a velocity-dependent manner.

A variation of the method in accordance with the invention is also preferred with which a linear change in the velocity-dependent phase is effected through change of the strength of the magnetic field gradient and/or of the electric field in a plurality of preferentially sequential recording steps. A splitting of the signals of particles having differing velocities then occurs after subsequent 2-dimensional Fourier transformation of the measured NMR signals.

A variation of the method is preferred with which a time-synchronized modulation of the magnetic field gradient and of the electric field gradient is effected, wherein a phase change preferentially occurs in spins moving in the electric field or in spins moving with constant velocity, in dependence on the phase position between modulation of the electric field and of the magnetic field gradient.

In an additional advantageous variation of the method, the electric field is perpendicular to the external magnetic field. This facilitates observation of the motion of particles using the so-called Hall-effect.

An advantageous method variation is distinguished in that at least one of the radio frequency pulses is a selective pulse having finite band width, to cause selection of a slice within the measurement volume in combination with a simultaneously applied magnetic field gradient. In this fashion, the measurement volume can be limited to a slice-shaped region within which optimal boundary conditions for data taking can be created. This slice selection can also serve as the first step for the recording of tomography-like NMR images of the particle motion in a particular slice.

Signal excitation can be effected in variations of the method through application of an additional radio frequency pulse to produce a so-called stimulated echo.

Alternatively, excitation can be effected by means of a single radio frequency pulse causing a so-called free induction decay (FID). The advantages and disadvantages of both excitation mechanisms are adequately described in the literature so that further discussion at this point is unnecessary.

An additional limitation of the measurement volume can be effected in preferred variations of the method by irradiating selective radio frequency pulses in the presence of magnetic field gradients having differing directions.

A variation of the method is advantageous with which time-dependent magnetic fields are applied in addition to the motion encoding and slice selection gradients to cause additional spatial encoding of the observed spins.

A variation of the method in accordance with the invention is particularly preferred with which an additional spatial encoding of the signal phase is effected through application of an additional gradient which is varied in sequential recording steps in such a fashion as to effect spatially resolved measurement of the components of motion.

DESCRIPTION OF THE PREFERRED EMBODIMENT

Figure 1:
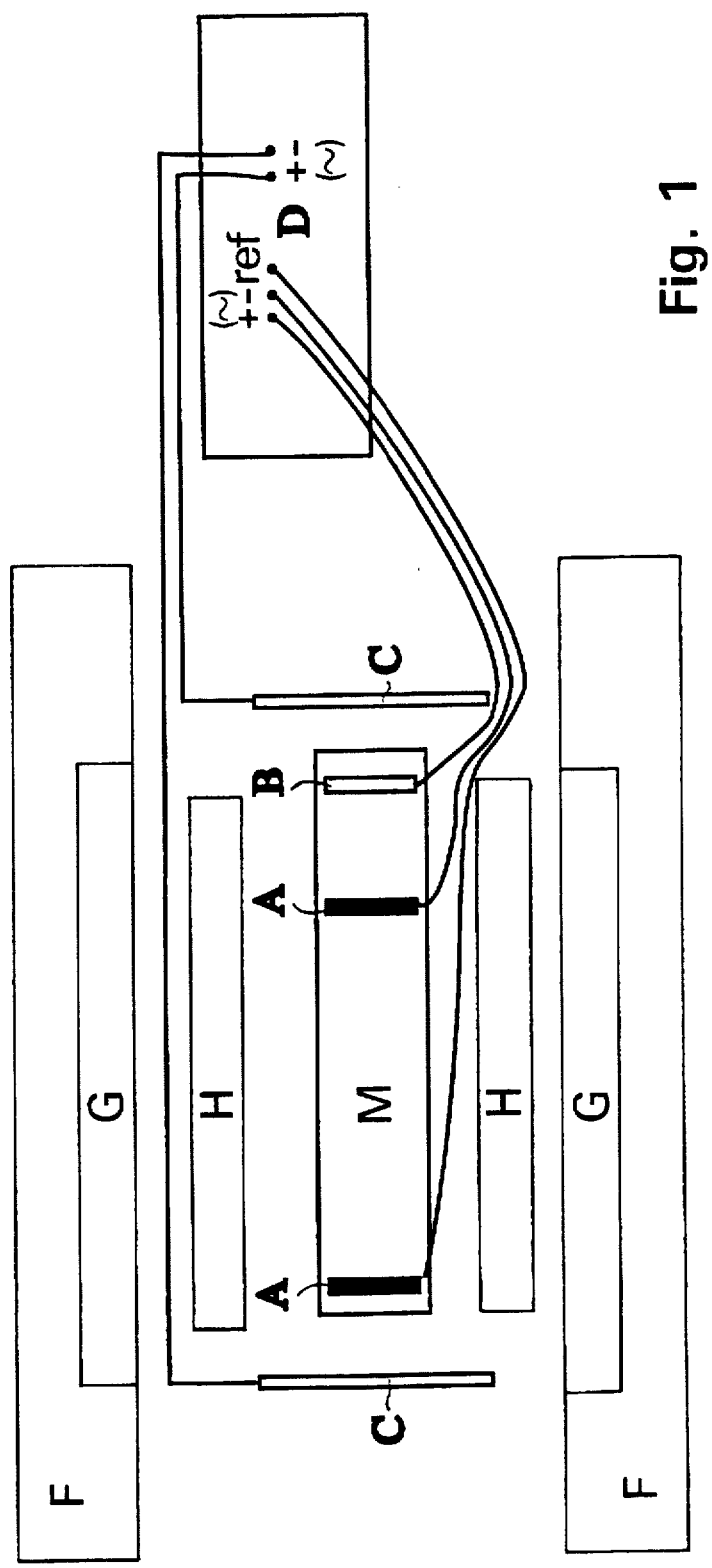
FIG. 1 shows a schematic of a measurement configuration for carrying out the method in accordance with the invention.

The apparatus utilized for the method in accordance with the invention has principle components schematically represented in FIG. 1. A gradient coil system G for the production of a magnetic gradient field which is variable in time is accommodated within a magnet F which produces a homogeneous external magnetic field constant in time. A high frequency coil or system of high frequency coils H for the production and detection of an NMR signal is disposed coaxially to the magnet F and the gradient system G and radially within the gradient system G. A measurement vessel M, having a measurement solution which is not shown in further detail, is located at the measurement center of the apparatus. Active electrodes A, in charge exchange contact with the measurement solution, as well as a reference electrode B for voltage stabilization are disposed within the measurement vessel M, with passive electrodes C being provided for on both sides of the measurement vessel M in axial extension thereof. The electrodes A, B, and C receive current and voltage from the power supply D which can be current or voltage regulated for production of DC (+–) or AC (~) current.

A substantially homogeneous electric field and thereby a constant drift velocity in accordance equation (1) can be achieved through appropriate geometric disposal of the electrodes A, B. The voltage which can be applied and therefore, for given electrode separation, the strength of the electric field and the drift velocity of particles associated therewith are limited by electrochemical electrode processes. In addition, the resulting current strengths should not be so high as to lead to energy deposition and thereby to heating via the ohmic resistance of the measuring cell to cause macroscopic convection which overlaps the actual effect to be measured.

In the event that the electrode voltage of the electrodes A and B in the measurement vessel M which results from the electrochemical and physical boundary conditions is sufficiently small to appear disadvantageous for measurement of the ion drift velocity, the electric field can be strengthened through use of the auxiliary outer electrode pair C. Since same are not in electrochemical contact with the measuring solution in the measurement vessel M, voltages can easily be utilized here which lie in the range of several hundred volts, whereas the voltage of the active electrodes A in ion-exchange contact is governed by electrochemical considerations and is typically (but not necessarily) in the range of several volts or even less depending on the system being investigated.

Regulation of the active electrodes A to a constant current strength is generally recommended, particularly when utilizing the outer auxiliary electrodes C, for maintaining a constant drift velocity and for preventing induced voltages caused by interaction between the outer and the inner electrodes.

Figure 2A:
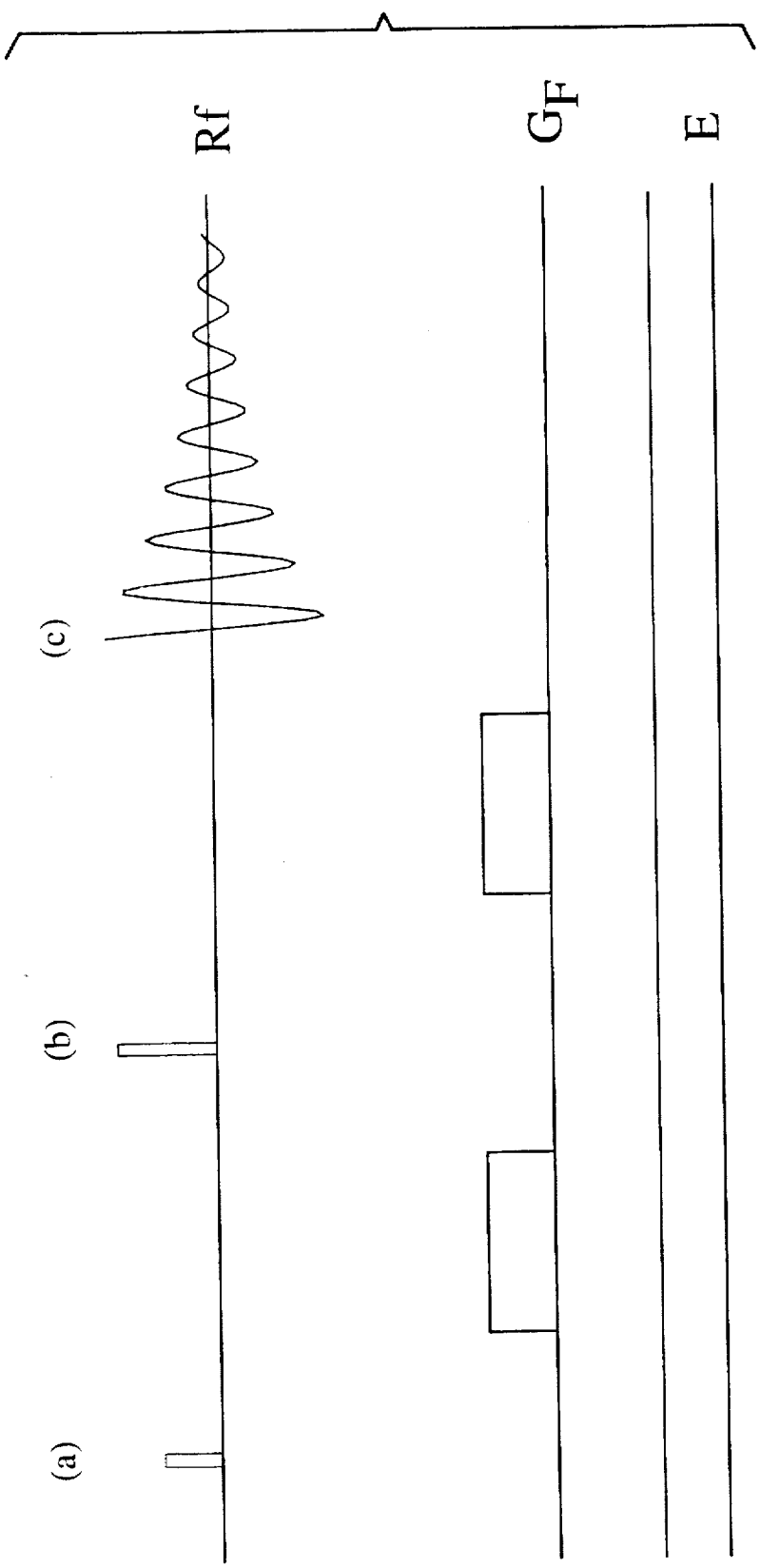
FIG. 2a sketches the time dependence of variations of the method in accordance with the invention having RF excitation and refocussing pulses along the time axis "Rf", magnetic field gradients "GF" which are switched-on and -off, as well as a constantly applied electric field "E"
Figure 2B:
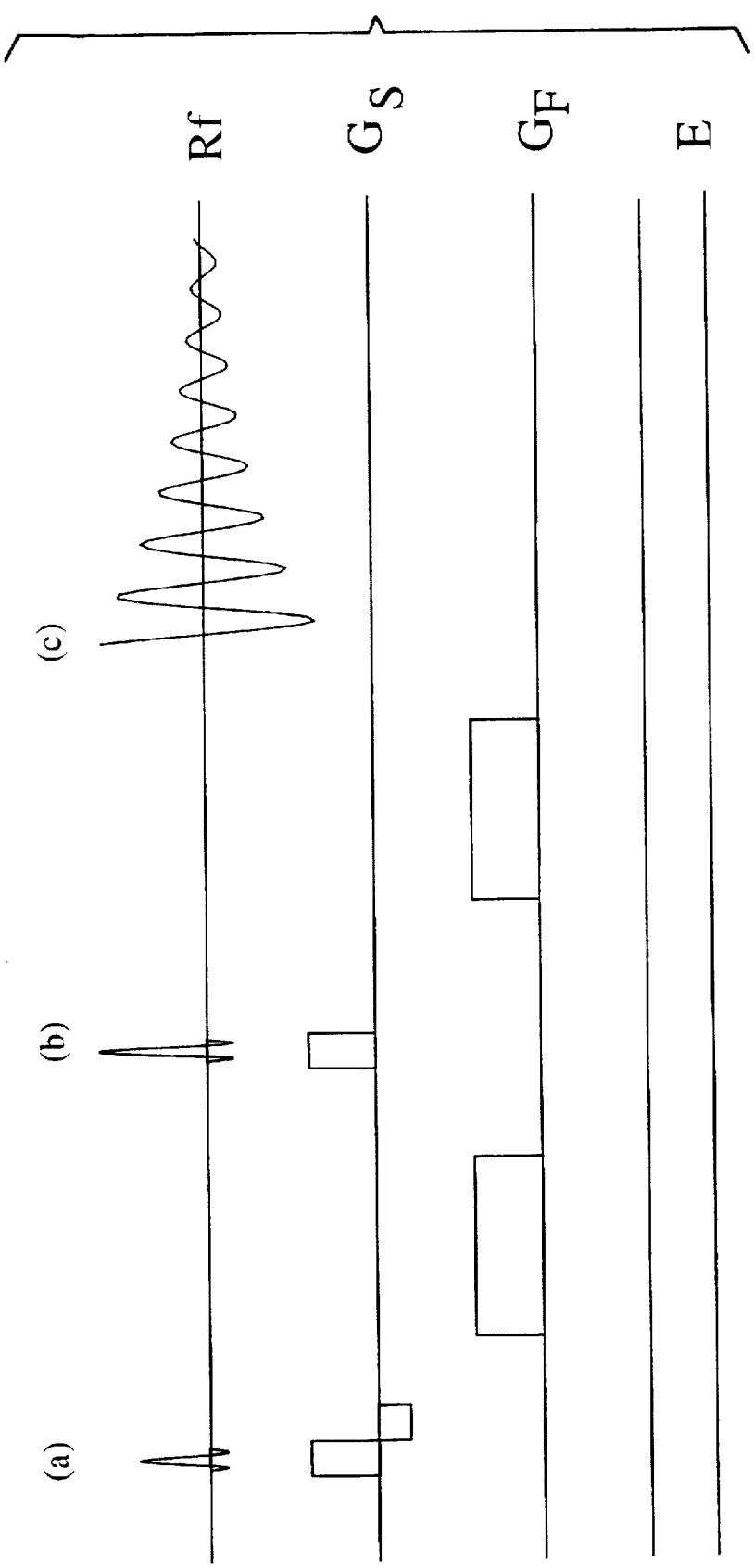
FIG. 2b sketches the time dependence of the fields similar to FIG. 2a, however, with additional slice selection gradient "$G_S$"
Figure 2C:
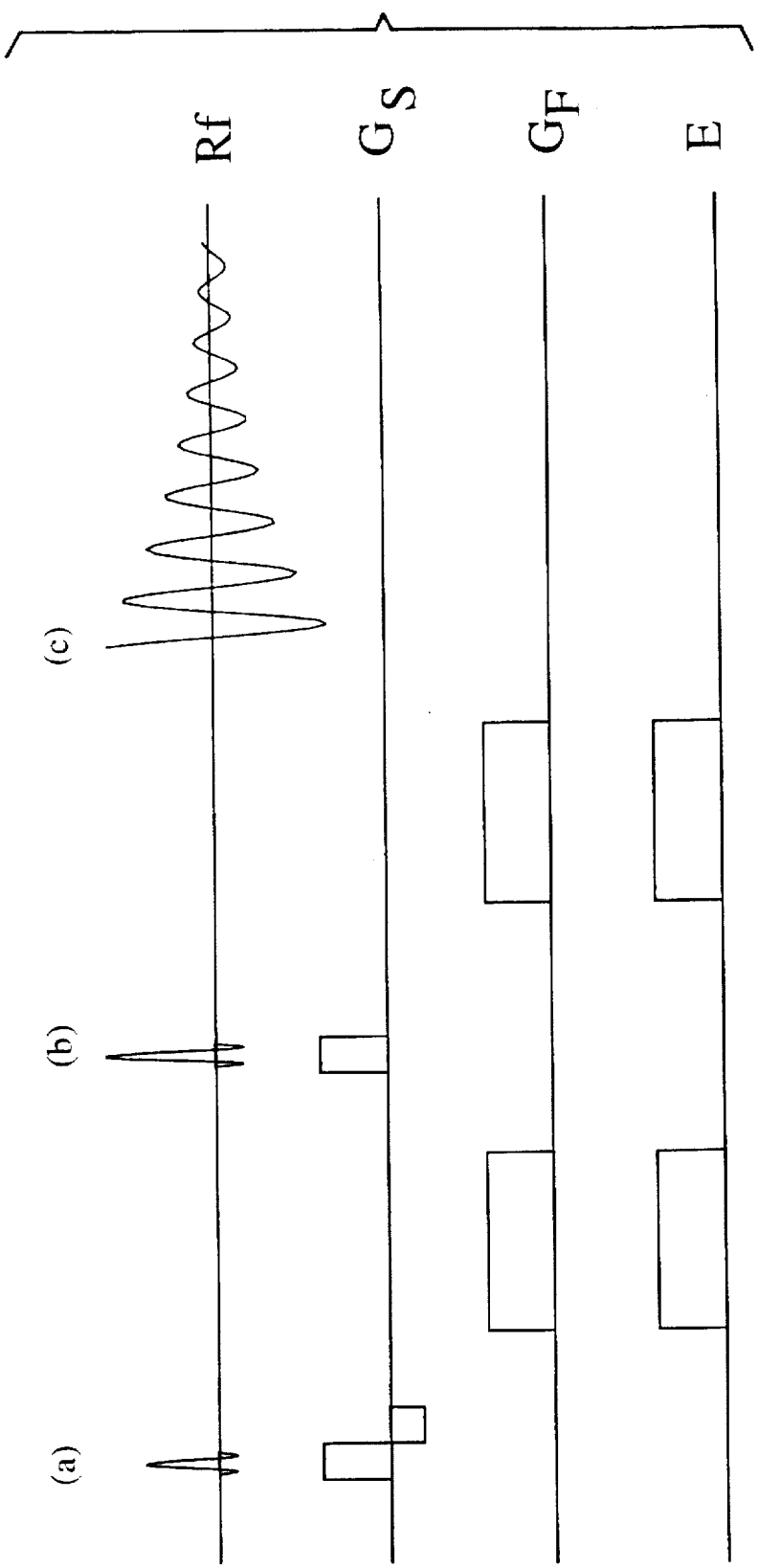
FIG. 2c is a schematic representation similar to FIG. 2b, however with a time interrupted electric field "E"

The principle experiment forming the basis of the method in accordance with the invention is represented in FIGS. 2a through 2c. The excitation pulse a, a refocussing pulse b, and the resulting NMR signal c are illustrated on the time axis Rf. Time-dependent switching of a magnetic gradient field GF, functioning as a motion encoding gradient, is represented in the middle time axis, whereas the lowermost time axis E illustrates the permanent application of an electric field having constant magnitude in time and space for this most simplest case shown.

The measurement takes place within a volume located between the electrodes A, B, C. The measurement volume can thereby be defined by the sensitive volume of the radio frequency coil H surrounding the measurement vessel M. However, better definition of the measurement volume is achieved using a radio frequency pulse in the presence of a slice selection gradient GS (FIG. 2b), wherein same is preferentially but not necessarily perpendicular to the electric field. In the simplest case, the apparatus is directed in such a fashion that the electric field is disposed parallel to the external magnetic field so that the overall motion of the moved charge carriers is not influenced by the above mentioned Hall-effect. However, a configuration perpendicular thereto precisely allows for investigation of same.

A magnetic field inside a cylindrical conductor having a homogeneous current distribution increases linearly from the inside towards the outside. The above mentioned change in the Larmor frequency caused thereby leads to a change in the linear dependence of the signal phase, at least for a gradient echo sequence, which overlaps the actual motion-induced effect which is to be measured. A spatially inhomogeneous signal phase likewise results from a non-homogeneous electric field in the actual measurement volume or from a time-dependent change in the current and thereby in the induced fields. A variation of the method in accordance with the invention is shown in FIG. 2c with which the electric field is applied only during a part of the measurement sequence. This prevents a change in the frequency of the spins due to the additional magnetic fields caused by current flow.

Using conventional spatial and time dependences for the electric field, detected signal phase and amplitudes which are influenced only by the magnetic field can be calculated through averaging over the measurement volume and separated from the motion-induced signal changes. Measurement techniques are possible with which same is likewise achieved through observation of the signal of a reference substance which is not subject to motion by the electric field and whose signal serves as a reference. Recording of reference spectra is also possible as an additional experimental means for differentiation between the differing occurring effects and can be carried out using applied motion-encoding gradients and without electric field as well as without applied motion-encoding gradient and with electric field, under otherwise identical measurement conditions.

A magnetic field gradient induced by a homogeneous current distribution can also be compensated for through the application of an auxiliary external magnetic field which can be produced through introduction of a coil of suitable geometry, wherein the auxiliary field produced by this coil can be regulated and adjusted to the prevailing conditions so that the effective magnetic field is homogeneous throughout the investigational volume.

An experimental improvement which prevents the occurrence of concentration gradients and, in particular, a passivation of the active electrodes due to substance deposit, is effected through a change of polarity of the electric fields between each of two recording steps when the experiment is carried out with a plurality of sequential recording steps as is normally done for improvement of the signal-to-noise ratio or for spatial encoding in spatially resolved experiments.

Figure 3:
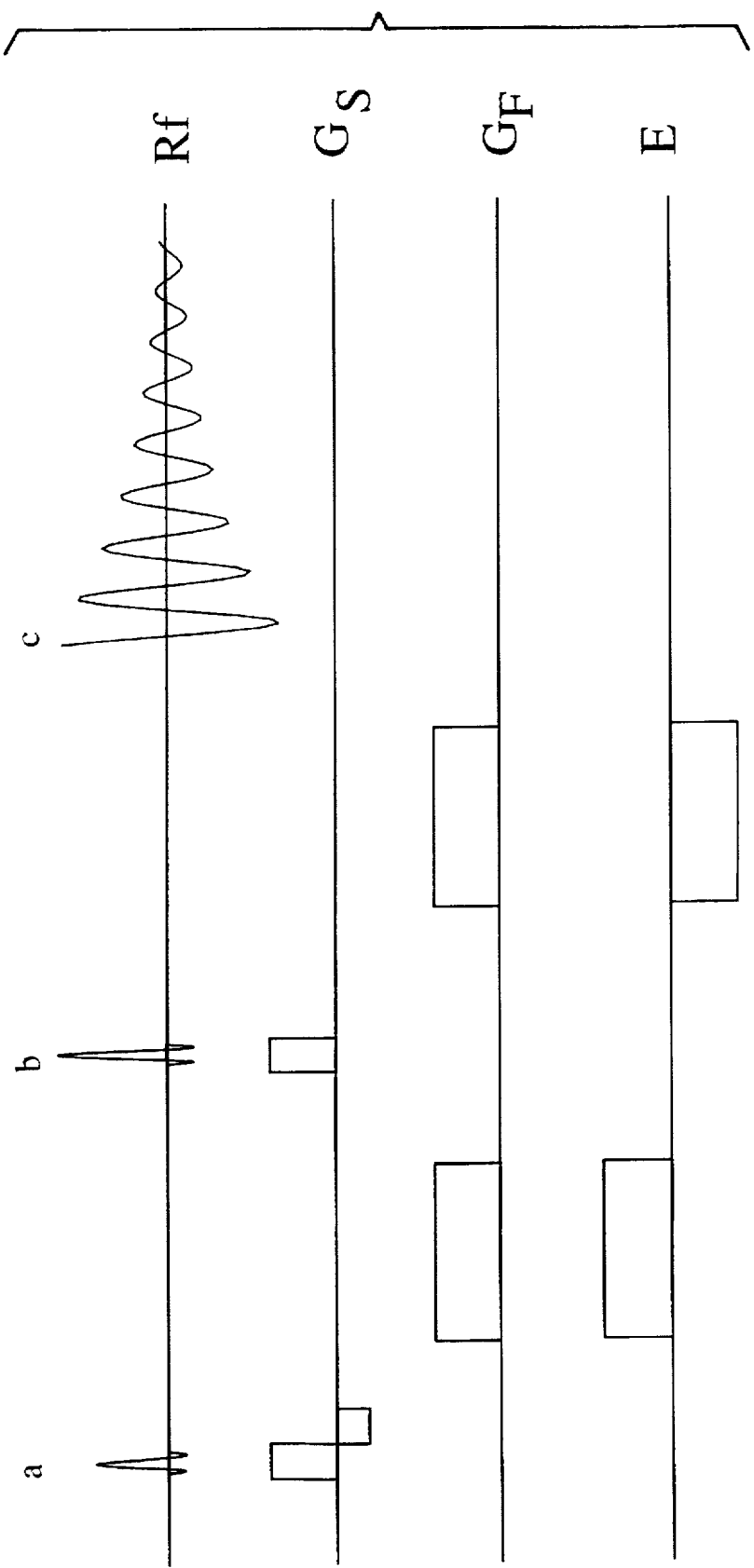
FIG. 3 is similar to FIG. 2c, however with the application of an electric field "E" having alternating polarity.
Figure 4A:
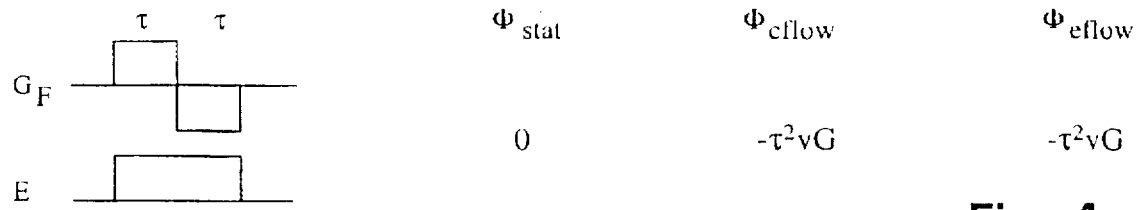
FIG. 4a shows a schematic representation of phase effects for a different combination of magnetic gradient field GF and electric field E, which are variable over time.
Figure 4B:
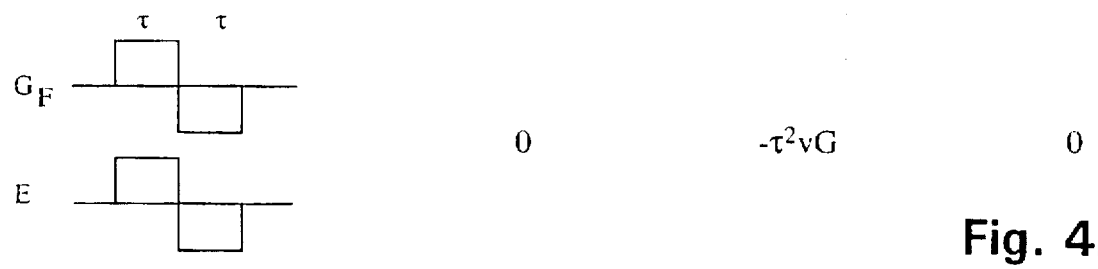
FIG. 4b shows a schematic representation of phase effects for a different combination of magnetic gradient field GF and electric field E, which are variable over time.
Figure 4C:
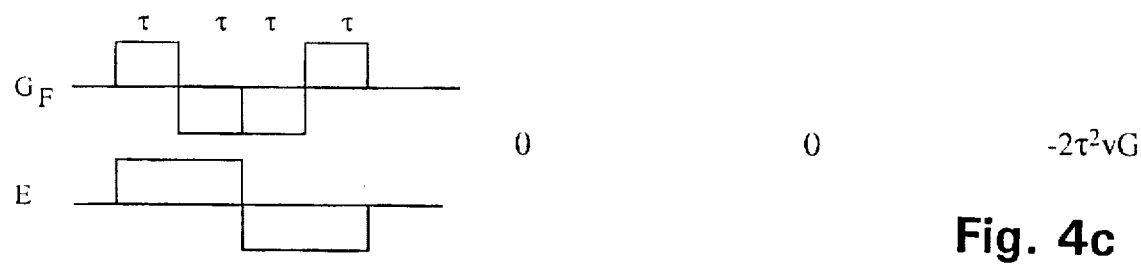
FIG. 4c shows a schematic representation of phase effects for a different combination of magnetic gradient field GF and electric field E, which are variable over time.
Figure 4D:
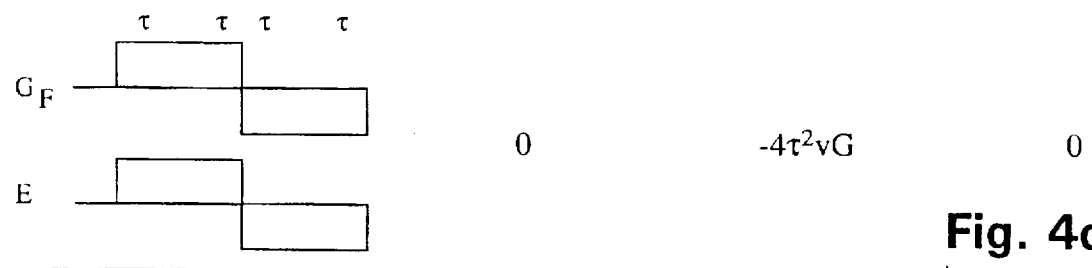
FIG. 4d shows a schematic representation of phase effects for a different combination of magnetic gradient field GF and electric field E, which are variable over time.
Figure 4E:
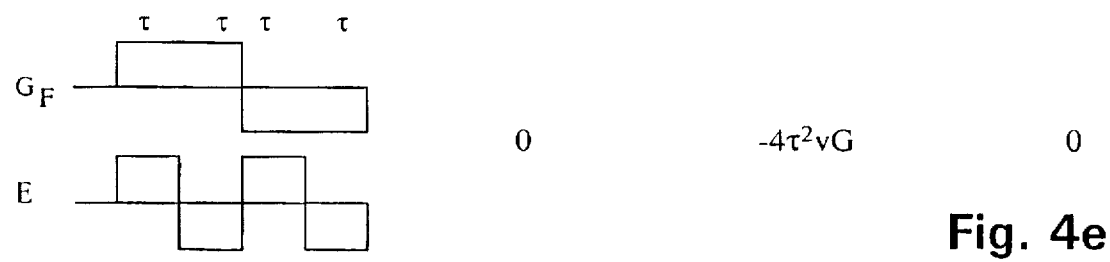
FIG. 4e shows a schematic representation of phase effects for a different combination of magnetic gradient field GF and electric field E, which are variable over time.

Finally, motion caused by the electric field (E-field) can be distinguished from motion which is constant in time by changing the electric field during the measurement in a time-dependent fashion. FIG. 3 shows an example wherein the electric field (and thereby the direction of the motion caused thereby) is reversed following the refocussing pulse. The excitation pulse is designated by a, the refocussing pulse by b, and the resulting NMR signal by c, the slice selection gradient by GS, the motion encoding gradient by GF, and the electric field by E. The synchronous switching of the electric field E together with the motion encoding gradient GF cause a dephasing of the particles moving in the electric field which is different than that of particles moving as the result of other mechanisms.

Using the formula known in the literature for the velocity-dependent dephasing $\Phi(t)$ in dependence on the strength of the time-dependent gradient $G_F(t)$ and position $x(t)$, $$\Phi(t) = \gamma \int_0^\tau G_F(t)x(\tau)dt \tag{2}$$

it is possible to show that particles moved in the electric field in this experiment have, in contrast to FIGS. 2a–c, a dephasing which is different than the phase development of spins having a velocity which is constant in time. $\gamma$ thereby represents the gyromagnetic ratio of the spins. The two experiments can thereby be linearly combined in such a fashion that only the signal phases dependent on the E-field remain.

FIGS. 4a through 4e show several examples of phase effects which occur with stationary spins, with spins moving at constant velocity, and with spins moving in the E-field in dependence on several simple combinations of time-dependent magnetic fields and E-fields. $\Phi_{stat}$ thereby indicates the phase of the static spins, $\Phi_{flow}$ the phase spins having constant motional velocity and $\Phi_{eflow}$ the phase of spins which move in the E-field.

Similar combinations can be created for arbitrary pulse sequences taking into consideration the phase reversal caused by the refocussing pulse. The examples of FIGS. 4c and 4d bear particular emphasis. A switching scheme in accordance with FIG. 4c leads to a phase effect only for spins moving in the E-field with other motion effects being compensated for, whereas the opposite occurs in FIG. 4d.

Compensation of high moments of motion (acceleration etc.) is also possible and reasonable. In this manner the particle motion can be analyzed in detail by combining different experiments having differing motional encoding for the various motion components. The examples shown in FIGS. 4a through 4e are thereby purely illustrative. Other combinations of time-dependent magnetic fields and electric fields can likewise be realized.

It can thereby be particularly advantageous to not switch both fields synchronously, rather to completely switch-off the rapidly switchable electric fields during the slower switching time of the magnetic gradient field in order to prevent inaccuracies caused by switching effects. In the event that the electric field is switched-off during data acquisition, the pure magnetic field effect caused by the moving charge carriers is precisely compensated for during the measurement so that the measured dephasing of the NMR signals can be directly assigned to the drift motion. Information concerning possible alignment of the molecules caused by the electric field which manifests itself in spectral changes is, of course, thereby lost.

The simple experiments described up to this point only allow for differentiation between particles moved in the E-field and stationary spins or spins moving due to other causes. The respective cation and anion fractions of the substances thereby exhibit opposite phase effects corresponding to their oppositely directed drift direction (and velocity).

Differentiation between signals from substances moving with differing drift velocities is possible through variation of the phase effect caused by the E-field. In this manner signals from substances having differing drift velocities can be separated in a two-dimensional Fourier transformation experiment having repeated measurements with which the motion-induced phase is linearly changed from one recording step to the next by varying the strength and/or duration of the magnetic field and/or of the electric field from one recording step to the next. The linear changes in phase then lead to a change in the position of the NMR signal in the corresponding direction of the data matrix following two-dimensional Fourier transformation.

Figure 5:
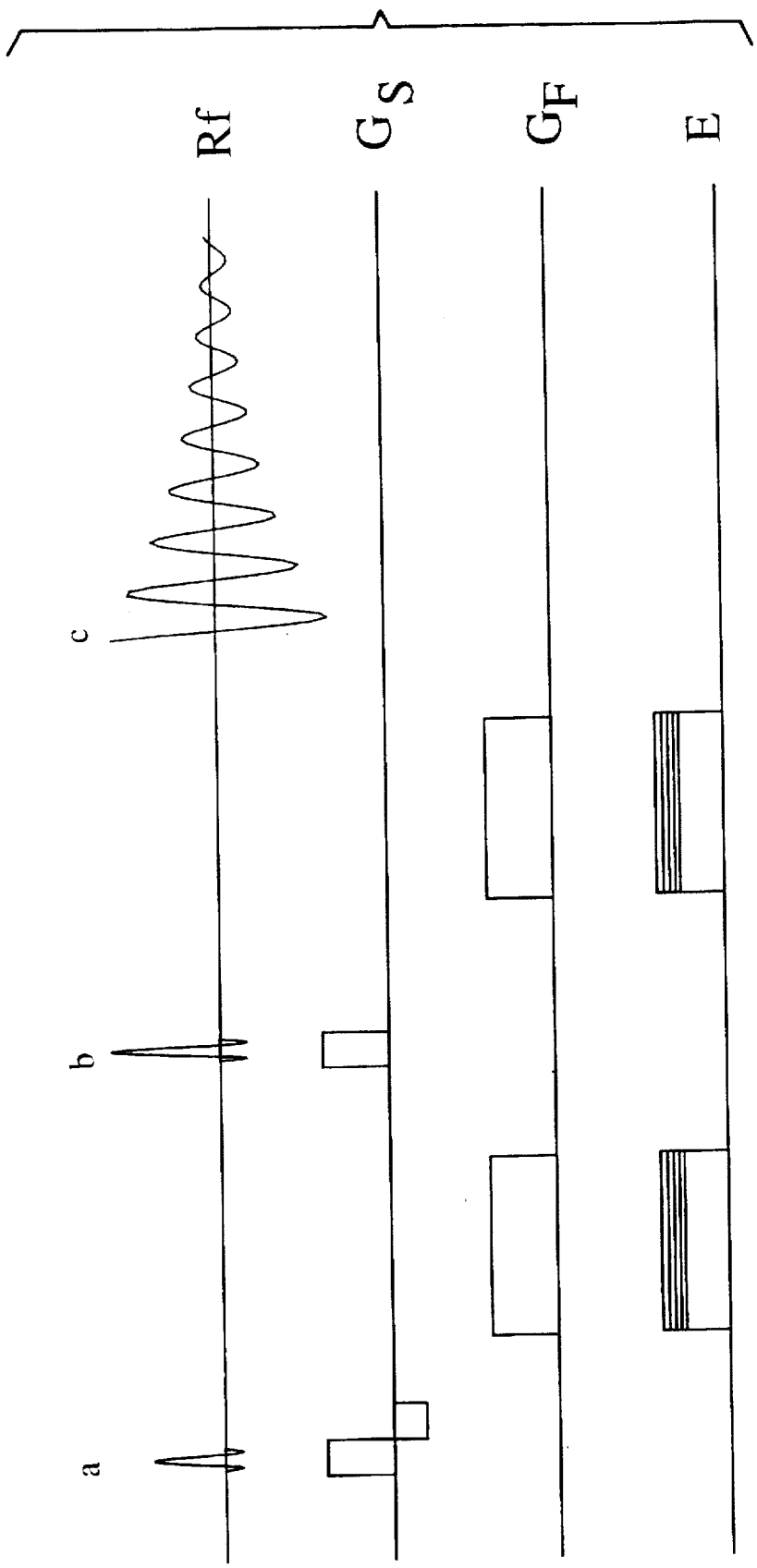
FIG. 5 shows a measurement scheme of a method variation in accordance with the invention for the differentiation of substances having different electric field mobilities.

In an experiment carried out in accordance with FIG. 5, a linear change in the signal phase of moved particles can be induced in sequential recording steps through linear variation of the amplitude of the time-dependent E-field. In this fashion selective separation according to ion motion in the E-field can be effected following recording of an appropriate data set for two-dimensional Fourier transformation. In the event that only the signal of one substance of known mobility is to be filtered out of a signal mixture, this can be done by combining individual measurements having differing E-field related phase encoding with simultaneous displacement of the phase reference utilized in the measurement in such a fashion that the signal of the substance to be investigated is coherently added, whereas the signals from other species which are stationary or moving with another velocity are averaged out for a sufficient number of repetitions. This selective coherent signal acquisition is described in the literature for other phase sensitive processes under the descriptive title 'phase rotation' (J. Hennig, The Application of Phase Rotation for Localized in Vivio Proton Spectroscopy with Short Echo Times, J. Magn. Res. 96, 40–49 (1993)). In the simplest case, motion encoding is effected through a phase angle of 180 degrees. Alternate addition and subtraction then leads to coherent increase in the intended NMR signal, whereas NMR signals from stationary substances are already eliminated after two recording steps.

Figure 6:
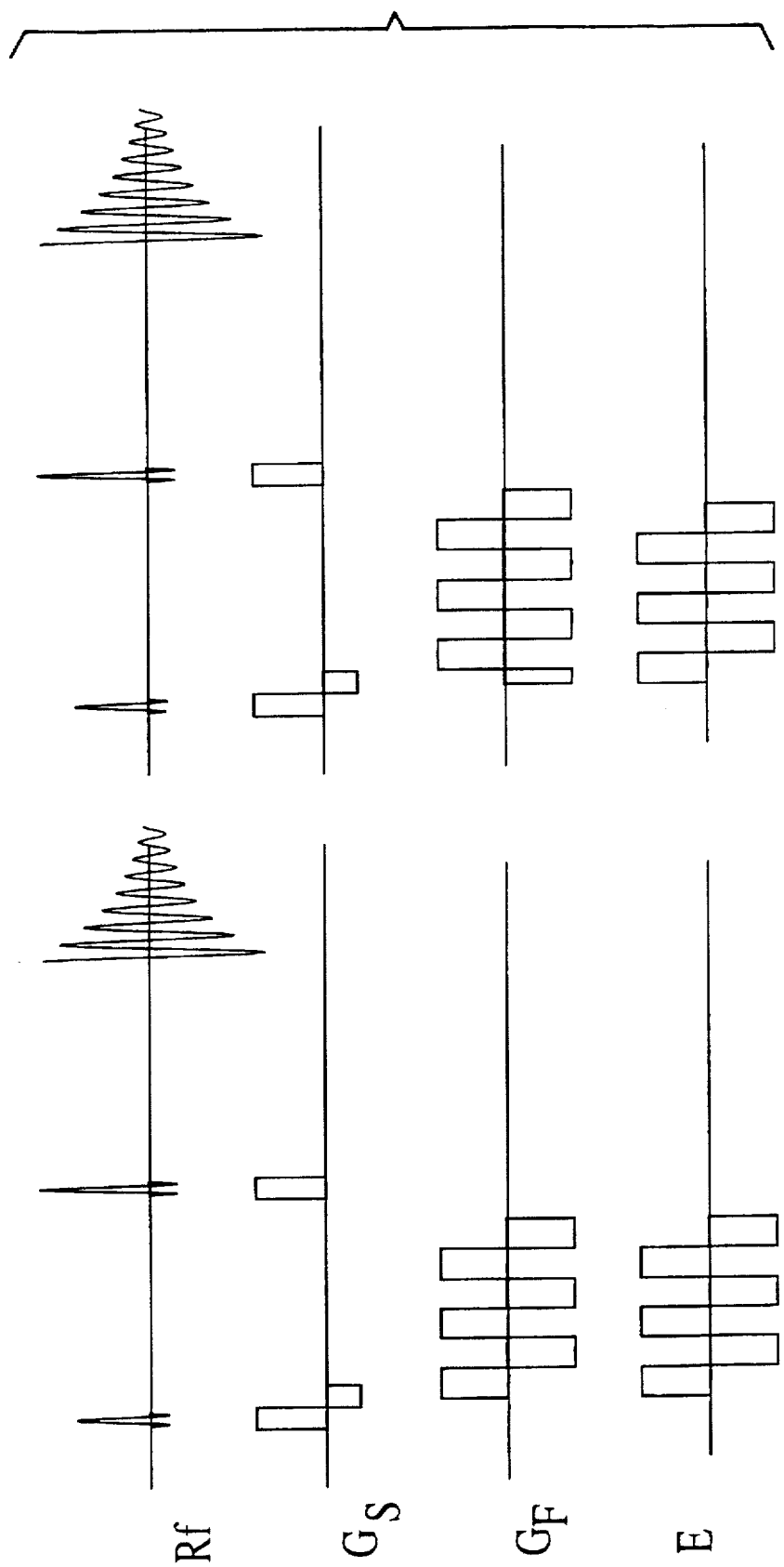
FIG. 6 shows a measurement scheme in a variation of the method in accordance with the invention for frequency-dependent measurement of the effect of the electric field.

The frequency sensitivity of the drift velocity is an additional characterizing parameter of field-induced motion. The inertia of molecules and molecular components can be determined through measurement of the dependence of the signal phase on the switching frequency of the electric fields and magnetic field gradients. The measurement region is thereby limited by the switching time of the magnetic field gradients. This experiment allows for differentiation between phase effects which are field-related and other phase effects caused by other technical boundary conditions by changing the measurement under variation of the phase position of the electric field and the magnetic field. In this manner the experiments shown in FIG. 6 can be derived from FIGS. 4c and 4d. In one case only the E-field independent motion components (inertial components) are observed (FIG. 6 left) and, by displacement of the relative phases of the electric field and magnetic field by 90 degrees, only the pure E-field-induced components (FIG. 6 right half) are measured. A rectangular signal shape is used for pedagogical reasons to illustrate the principle in comparison to FIG. 4. In practical applications, an embodiment with sinusoidal time dependence is often more advantageous.

With such experiments having electric fields variable in time, one should note that it is not absolutely necessary to utilized active electrodes, in particular for the region of higher frequencies, since it is not necessary for effective charge transport to occur. Active electrodes can, however, be useful in order to compensate for the build-up of a field directed oppositely to the nominal field in consequence of polarization through the collection of charge carriers.

In all experiments having time-dependent magnetic fields, it is particularly important to avoid changes in the E-field during switching of the magnetic field caused by electrical induction. This can be prevented e.g. by appropriate shielding of an electrode feed cable.

It should finally be mentioned that measurements can also be carried out with which the electric field is not disposed parallel to the magnetic field necessary for the production of magnetic resonance imaging signals. In a configuration having mutually perpendicular fields, motion of the particles towards the electrodes overlaps with a deflection motion caused by the magnetic field (the so-called Hall-effect). Appropriate application of the above described experiments facilitates, in this case, a determination of not only the motional component in the direction towards the electrodes but also the resulting Hall-effect by choosing the direction of the time-dependent magnetic field gradients to be perpendicular to the external field. Measurements of the motion parameters in all three spatial directions facilitate a complete analysis of the molecular motion.

Figure 7:
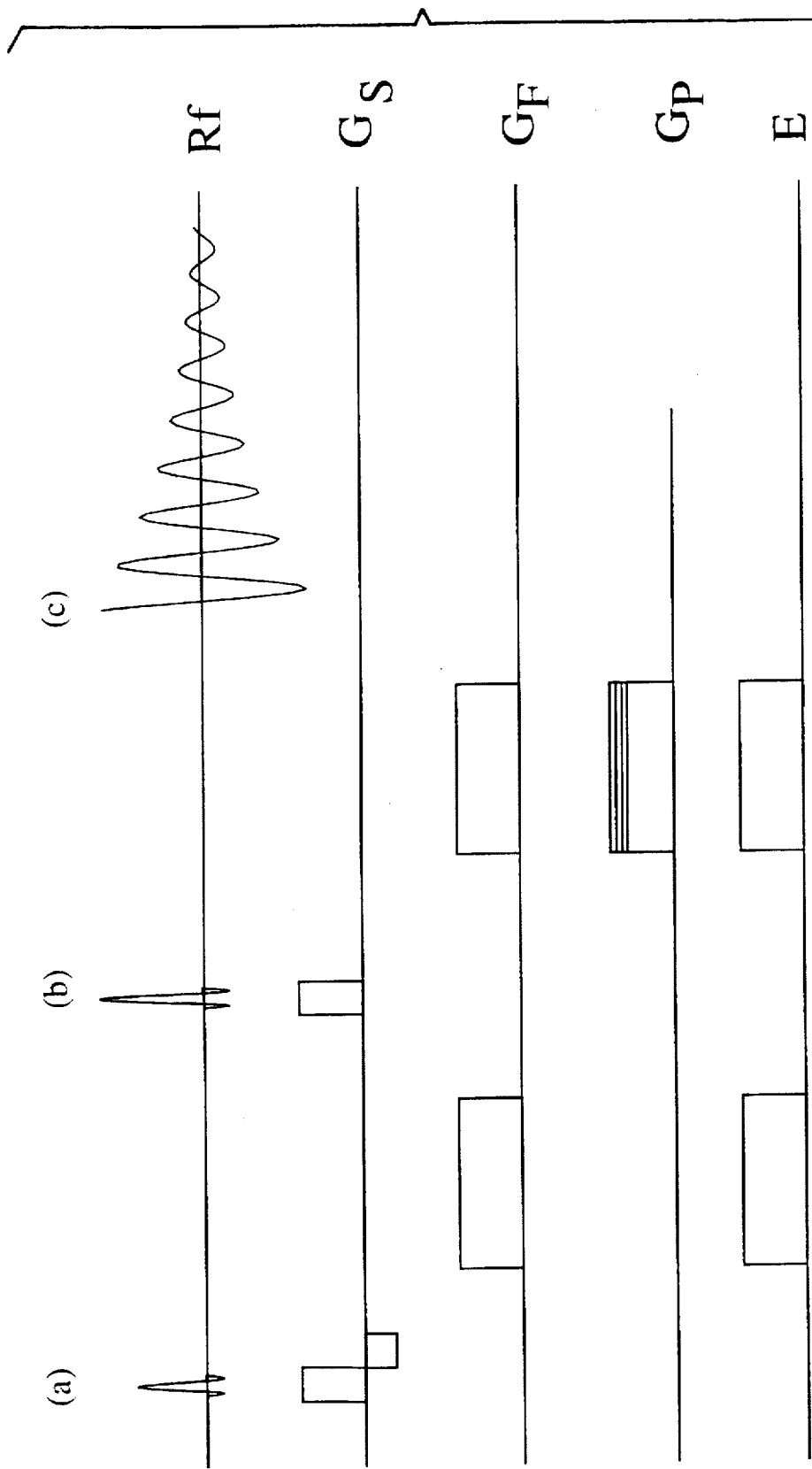
FIG. 7 is a measurement scheme of an embodiment of the method in accordance with the invention for spatially resolved measurement of ion motion in the electric field.

Instead of measuring the entire signal in selected volumes using appropriate conventional methods, a variation of the experiment effects additional spatial resolution through combination with a so-called chemical shift imaging method for the production of a one-, two- or three-dimensional spatially resolved data set (FIG. 7). In contrast to the experiment in accordance with FIG. 2c the method represented in FIG. 7 introduces a phase encoding gradient GP which is varied in sequential recording steps in such a fashion that spatial resolution along the phase encoding gradient GP occurs following two-dimensional Fourier transformation. The experiment can be extended to a two- or three-dimensional spatially resolved experiment through application of additional phase encoding gradients each directed perpendicular to one another.

Figure 8:
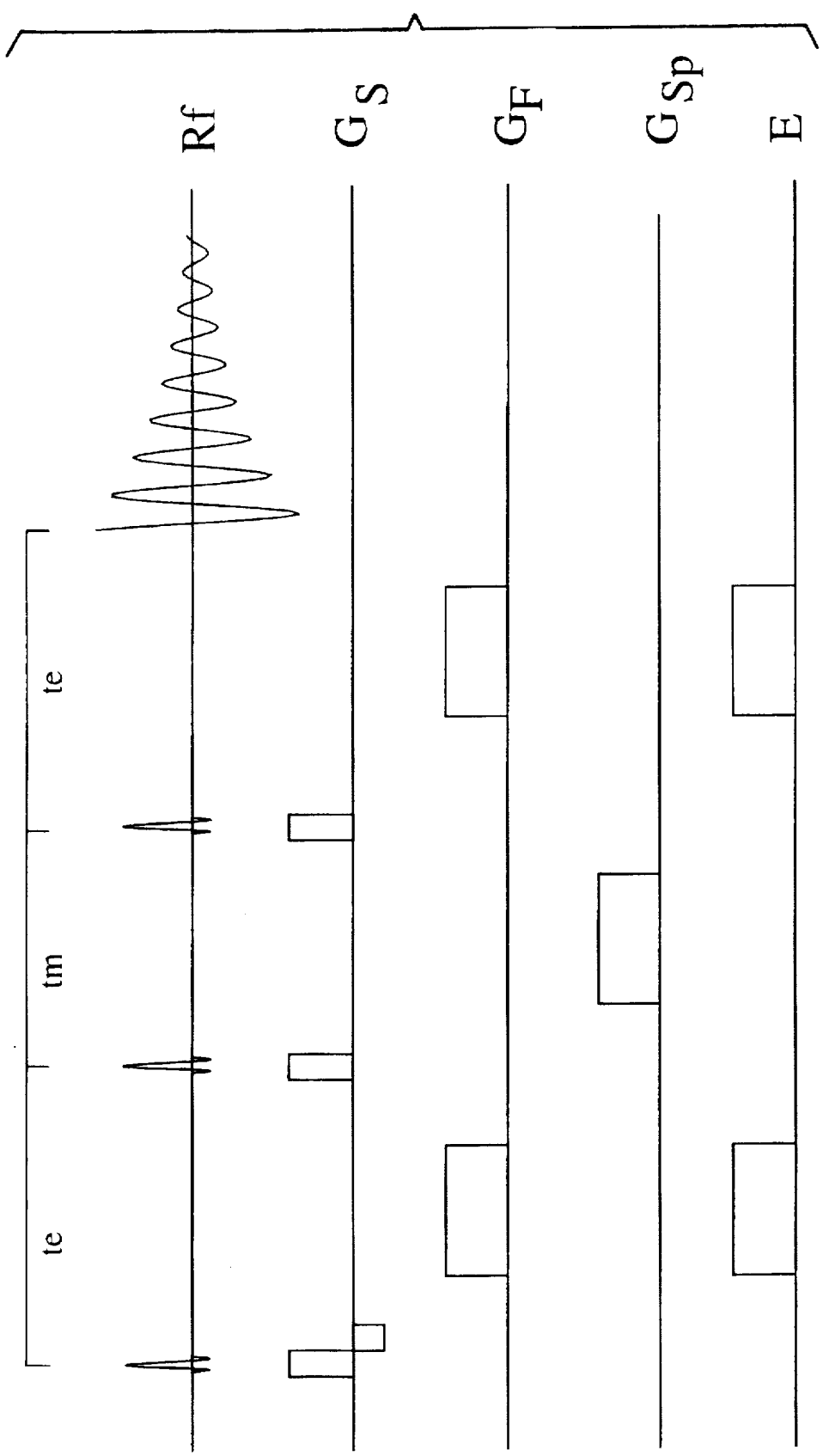
FIG. 8 is a measurement scheme of a method variation in accordance with the invention with which, in contrast to FIG. 2c, signal excitation is carried out using a stimulated echo.

Other excitation sequences having e.g. only one excitation pulse for observation of the free induction decay or a plurality of excitation pulses for signal read-out e.g. in the form of a stimulated echo, are easily possible and known to one of average skill in the art from other experiments. An example is shown in FIG. 8. The additional gradient GSp acts as a so-called spoiler gradient for suppression of undesired signals. The time conditions for formation of a stimulated echo are shown in the upper part of the scheme in accordance with FIG. 8, wherein the formation of the stimulated echo occurs independent of the length of the time period tm and same must only be sufficiently short to prevent signal decay by longitudinal relaxation.

Figure 9:
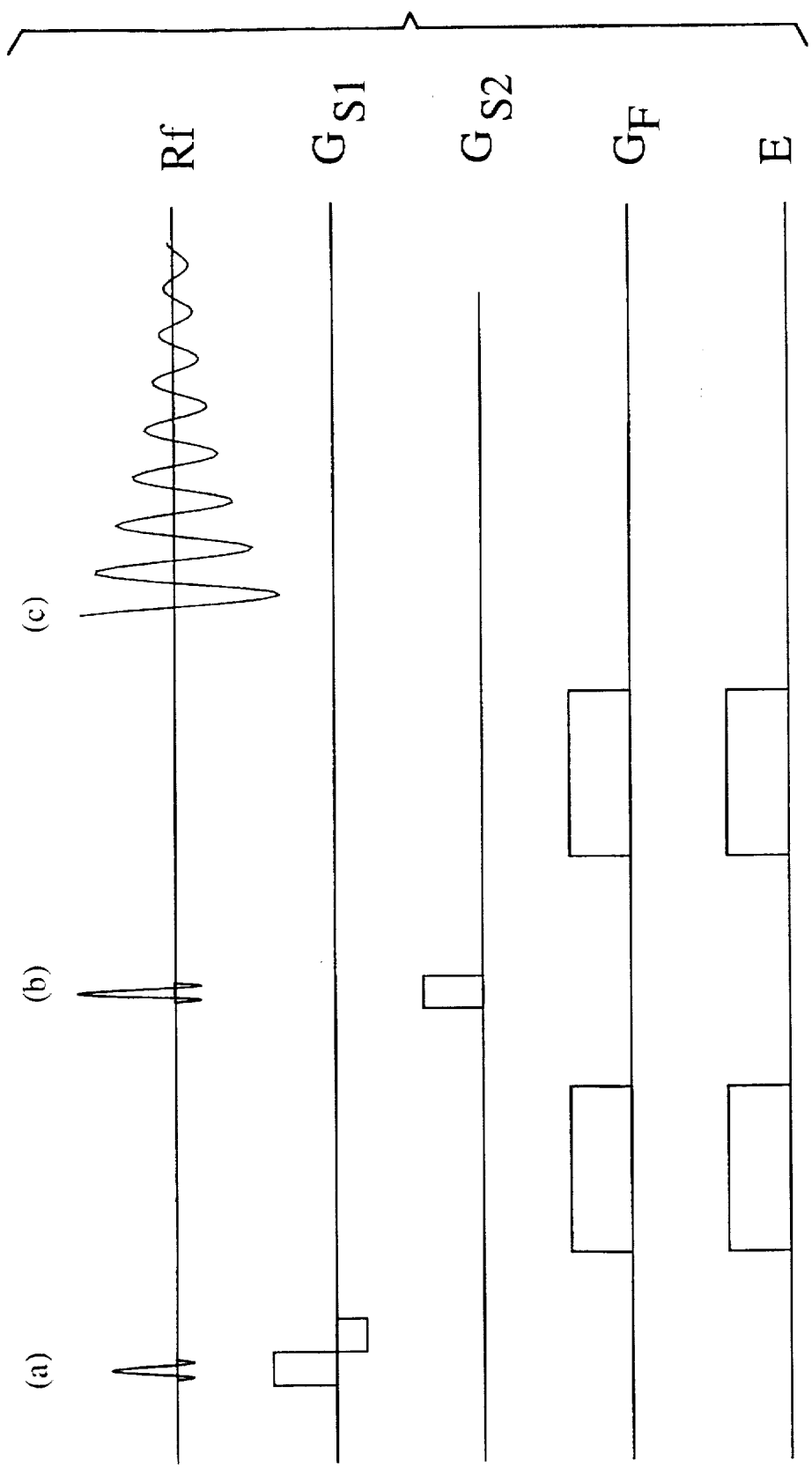
FIG. 9 is a measurement scheme of a variation of the method in accordance with the invention with which, in contrast to FIG. 2b, two mutually perpendicular magnetic field gradients are utilized for additional limitation of the investigational volume.

An additional technique for limitation of the measurement volume using additional slice selection pulses is, in and of itself, also known in the art. In the method variation shown in FIG. 9 for measurement of ion motion in the electric field, in contrast to the method shown in FIG. 2b, two mutually perpendicular magnetic field gradients GS1, GS2 are utilized for additional limitation of the investigational volume.

Figure 10:
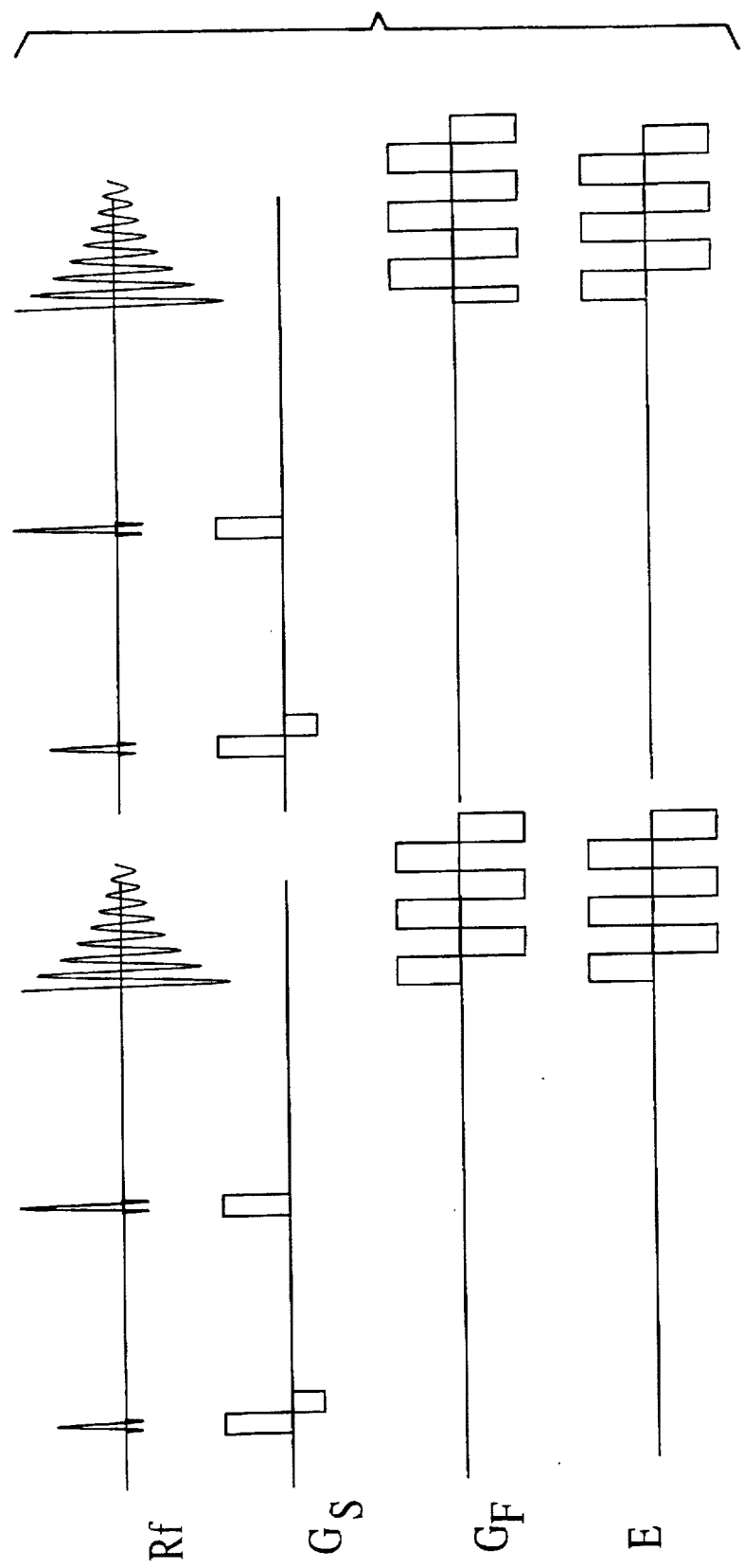
FIG. 10 shows a measurement scheme of a variation of the method in accordance with the invention having data acquisition during signal modulation via the electric field and the magnetic gradient field.

Finally, application of the time-dependent gradients and of the E-field during data acquisition causes time-dependent modulation of the phase and frequency of the recorded signal, wherein the motion-induced phase effects can be determined following demodulation of the purely magnetic field-related changes. A scheme for the frequency-dependent measurement of effects caused by the E-field via data acquisition during signal modulation by the E-field and the magnetic field gradient GF is shown in FIG. 10.

I claim:

1. A method of nuclear magnetic resonance (NMR) spectroscopy for measuring velocity-dependent changes in the phase or amplitude of signals from spins located in a sample, the sample containing charged, polar, or polarizable molecules, the method comprising the steps of:

locating the sample in a homogeneous external magnetic field;

irradiating radio frequency pulses into the sample to excite a spin signal;

applying a time-dependent electric field to the sample to induce motion of the spins;

applying a magnetic gradient field variable in space and time to the sample following excitation of said spin signal to effect a velocity-dependent change in the spin signal of spins moved by said time-dependent electric field in a direction of said magnetic gradient field; and reading-out said spin signal to record said velocity-dependent change along said magnetic gradient field, wherein said time-dependent electric field and said magnetic gradient field impart a velocity-dependent phase to spins moved by said time-dependent electric field which is different than a phase of spins moved by other mechanisms.

2. The method of claim 1, wherein said electric field has a direction parallel to both a direction of said homogeneous external magnetic field and to a direction of said magnetic gradient field.

3. The method of claim 1, further comprising the step of switching-off said electric field prior to reading-out said spin signal.

4. The method of claim 1, wherein at least one of a strength, a duration, and a time dependence of said magnetic gradient field causes a velocity-dependent dephasing of moved spins and constant phase of stationary spins.

5. The method of claim 1, wherein at least one of a strength and a duration of said electric field and of said magnetic gradient field cause constant phase for stationary spins and for spins moving with a velocity which is constant in time, whereas a phase of spins moving in consequence of said electric field changes in a velocity-dependent fashion.

6. The method of claim 1, wherein at least one of a strength and a duration of said electric field and of said magnetic gradient field cause constant phase for stationary spins as well as for spins moving in consequence of said electric field, whereas a phase of spins having a motional velocity which is constant in time changes in a velocity-dependent fashion.

7. The method of claim 1, wherein a linear change of a velocity-dependent phase is effected through change of a strength of at least one of said magnetic field gradient and said electric field in a plurality of recording steps.

8. The method of claim 1, further comprising modulating said magnetic gradient field and said electric field in a time-synchronous fashion to change a phase of moving spins in dependence on a phase position between a modulation of said electric field and of said magnetic gradient field.

9. The method of claim 1, wherein a direction of said electric field is perpendicular to a direction of said external magnetic field.

10. The method of claim 1, wherein at least one of said radio frequency pulses is a selective pulse having finite band width and further comprising applying a magnetic field gradient simultaneous with said radio frequency pulse of finite band width for causing selection of a slice within the sample.

11. The method of claim 1, wherein said radio frequency pulses generate a stimulated echo.

12. The method of claim 1, wherein said radio frequency pulses generate free induction decay.

13. The method of claim 1, further comprising applying magnetic field gradients having differing directions, wherein said radio frequency pulses are selective pulses irradiated during application of said magnetic field gradients having differing directions.

14. The method of claim 1, further comprising applying an additional time-dependent magnetic field to cause additional spatial encoding of observed spins.

15. The method of claim 14, wherein said additional spatial encoding is caused through application of additional gradients which are varied in sequential recording steps for spatially resolved measurement of motional components.

* * * * *